United States Patent [19]
Thompson

[11] 3,943,462
[45] Mar. 9, 1976

[54] ANTIREFLECTION COATINGS FOR INJECTION LASERS

[75] Inventor: George H. B. Thompson, Harlow, England

[73] Assignee: International Standard Electric Corporation, New York, N.Y.

[22] Filed: Feb. 5, 1974

[21] Appl. No.: 439,806

[30] Foreign Application Priority Data
Feb. 6, 1973 United Kingdom............... 5783/73

[52] U.S. Cl. ............... 331/94.5 H; 350/1; 350/164
[51] Int. Cl.² ............................................. H01S 3/00
[58] Field of Search .................. 350/1, 164, 288; 331/94.5 H

[56] References Cited
UNITED STATES PATENTS
3,849,738  11/1974  Hakki ......................... 331/94.5 H OTHER PUBLICATIONS
Ettenberg et al., "Control of Facet Damage in GaAs Laser Diodes," *Applied Physics Letters*, Vol. 18, pp. 571–573, 6-15-71.

*Primary Examiner*—Edward S. Bauer
*Attorney, Agent, or Firm*—John T. O'Halloran; Menotti J. Lombardi, Jr.

[57] ABSTRACT

Antireflection dielectric coatings on the output face of an injection laser provide a negative electric vector amplitude reflection coefficient which increases the obtainable power output. Like coatings are applied to the opposite reflective face. The output layers are preferably three quarter-wavelength coatings of titania, silica and titania. The opposite reflective layers are two quarter-wavelength coatings of titania and silica and an outer metallic layer of aluminum. Silicon monoxide can also be used in place of titania.

7 Claims, 2 Drawing Figures

ANTIREFLECTION COATINGS FOR INJECTION LASERS

BACKGROUND OF THE INVENTION

1. Field of the Invention

This invention relates to injection lasers, and in particular to antireflection coatings for pulsed high power injection lasers.

2. Description of the Prior Art

There is a limit to the peak power that can be generated by an injection laser. If this threshold is exceeded the output facet of the laser is destroyed. The disruption of this output facet has been attributed to local heating resulting from residual optical absorption in the material of the lasing filament. The surface damage is then explained on the basis that the heating is most severe at the output facet because this is where the optical intensity is greatest.

The ratio of this peak value of optical intensity to the light output of the laser is related to the reflectivity of the facet. Thus it has been predicted that treatment of this facet to reduce its coefficient of optical intensity reflectivity (R) would produce an increase in the destruction threshold. This prediction has been verified by practical experiment. The destruction threshold of an untreated laser has been reduced by a factor of about 2 by the use of a reflection reducing coating consisting of a layer approximately a quarter-wavelength thick of silicon monoxide. The electric vector amplitude reflection coefficient (r) of a GaAs - air interface is positive, and this use of silicon monoxide provides the surface with a reduced amplitude reflection coefficient (r). (The coefficient of reflectivity (R) is also reduced because $R = r^2$). Prior art articles discussing antireflection coatings for light emitting diodes and damage caused by high power laser pulses are found in the Journal of the Electrochemical Society, November 1963, pages 1124–1126 and Applied Physics Letters, Oct. 15, 1972, pages 364–366.

Optical feedback is however required for laser action, and hence there is a lower limit to the value of R which can usefully be employed. This provides an upper limit to the increase in destruction threshold which can be obtained with a positive electric vector amplitude reflection coefficient (r).

SUMMARY OF THE INVENTION

It is therefore the primary object of the present invention to provide an increased power output for a laser and an increased destruction threshold. According to the invention, this is accomplished by providing the reflecting optical output facet of an injection laser with an optical interference coating having a negative electric vector amplitude reflection coefficient.

Physically this corresponds to the situation where the electric field components of the incident and reflected waves are in antiphase at the output facet. Normally a laser is required to have only one output facet, in which case the other facet is generally backed by a metal layer to provide substantially total reflection. This metal layer cannot normally be placed directly on the laser because this would have the effect of putting an electrical short circuit across it. Therefore, a dielectric layer is used as a spacer. When the output facet is provided with a positive electric vector amplitude reflection coefficient it is always the output facet which is destroyed rather than the totally reflecting one. With a negative electric vector amplitude reflection coefficient, it would however be possible for the conditions to be such that the totally reflecting facet would be destroyed before the threshold of the output facet was reached. This risk can be eliminated by a construction of dielectric spacer which provides a negative electric vector amplitude reflection coefficient at this facet also.

There follows a description of an injection laser embodying the invention in a preferred form.

DESCRIPTION OF THE PREFERRED EMBODIMENT

Figure 1:
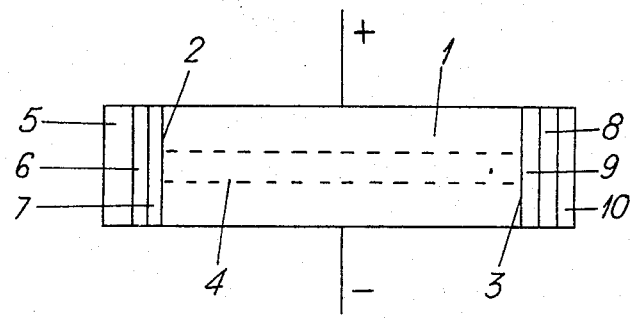
FIG. 1 schematically depicts a section through the laser.

Referring to FIG. 1 a GaAs semiconductor laser die is depicted at 1 with its cleaved reflecting facets at 2 and 3, and its active region at 4.

The reflecting facet 2 is provided with a reflection enhancing coating comprising a metallic reflecting layer 5 of aluminum spaced from the facet 2 by dielectric layers 6 and 7. The aluminum layer 5 may not be placed directly on the laser because that would short-circuit it. Layers 6 and 7 are quarter-wavelength thickness layers of silica and titania respectively and cooperate with the metallic reflecting layer 5 to provide a negative electric vector amplitude reflection coefficient for this facet.

The reflecting facet 3 is the output facet of the laser, and is provided with an interference coating having a negative electric vector amplitude reflection coefficient comprising a quarter-wavelength thickness layer 8 of silica sandwiched between two quarter-wavelength thickness layers 9 and 10 of titania.

Analysis of the behavior of optical interference layers is not usually made in terms of amplitude reflection coefficients, but analogous problems are encountered in the field of microwave engineering where the analysis is commonly developed in terms of admittance. Therefore, the analysis of the behavior of alternate high and low refractive index layers in producing a negative electric vector reflection coefficient r will now be examined as an admittance problem. The characteristic admittance of a dielectric is proportional to its refractive index. A wave analysis involves the use of the three following facts:

a. The characteristic admittance of a dielectric is proportional to its refractive index, b. For a wave going from a medium of characteristic admittance $Y_o$ into a medium with an admittance $Y_1$ the reflection coefficient is given by:

$$r = (Y_o - Y_1)/(Y_o + Y_1)$$

and c. The placing of a quarter-waveplate of characteristic admittance $Y_o$ in front of an admittance $Y_1$ forms a quarter-wave transformer, and hence the admittance of the combination is $Y_o^2/Y_1$.

Analysis will now be given of the behavior of light emitted through reflecting facet 3 from the laser 1, refractive index $n_3$, through the titania layer 9, refractive index $n_1$, through the silica layer 8, refractive index $n_2$, through the titania layer 10 refractive index $n_1$, and into air, refractive index 1. Using relations (a) and (c) it can be seen that:-
1. the admittance of the layer 10 – air interface is 1,
2. the admittance of the layer 8 – layer 10 interface is $n_1^2$,
3. the admittance of the layer 9 – layer 8 interface is $n_2^2/n_1^2$, and
4. the admittance of the layer 4 – layer 9 interface is $n_1^4/n_2^2$.

Using the relation (b) it is seen that the electric vector amplitude reflection coefficient $r$ is given by the expression:-

$$r = (n_3 n_2^2 - n_1^4)/(n_3 n_2^2 + n_1^4)$$

Assuming that the refractive index of GaAs is 3.6, of silica is 1.43, and of titania is 2.4, $$r = -0.64$$

Figure 2:
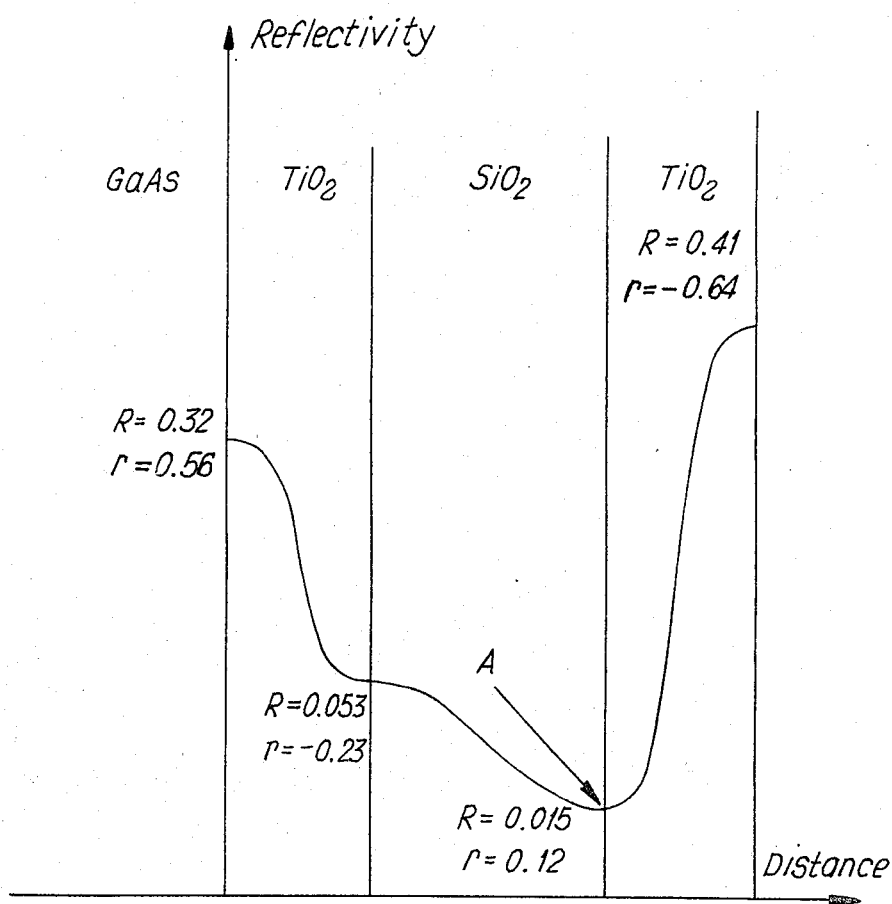
FIG. 2 is a graph showing the reflectivity changes which occur during the deposition of the interference coating on the output facet of the laser.

FIG. 2 shows the calculated changes of reflectivity which occur during the deposition of the three interference layers on the reflecting facet 3. It may be noted that the final (intensity) coefficient of reflectivity R is greater than the initial reflectivity R. The deposition of the two interference layers 6 and 7 on reflecting facet 2 follows the same procedure but is terminated at A whereafter the aluminum film is deposited by evaporation.

It is to be understood that many alternative interference layer structures and/or dielectric materials can be employed to form the requisite negative electric vector amplitude reflection coefficients. For instance, FIG. 2 shows that a single quarter-wavelength thickness layer of titanium will produce a negative $r$. An example of the use of a different dielectric material is given by the use of silicon monoxide in place of titania for the high refractive interference layers 7, 9 and 10.

Other odd numbers of alternately high and low refractive index quarter-wavelength thickness layers satisfying the relationship $n_1^2(n_1/n_2)^{2p} > n_3$, where the number of layers is $(2p+1)$, will also produce a negative $r$. The coefficient goes more negative with increasing number of layers.

It is believed that, in the absence of any interference coating, the factor controlling the value of the peak power that can be generated is the value of the electric field at the output facet. It is therefore instructive to derive the relationship between the power output of the laser, the electric field at its output facet and the electric vector amplitude reflection coefficient at this facet.

The total electric field $E_t$ at the output facet is $E(1 + r)$ where E is the incident field at the facet and $r$ is its amplitude reflection coefficient. The power output P is $E^2(1-r^2)$.

Therefore $$P = E_t^2(1-r)/(1+r)$$

Assuming a value of 3.6 for the refractive index of gallium arsenide, the reflectivity intensity coefficient of reflectivity of an uncoated facet is about 0.32 (corresponding to an electric vector amplitude reflectivity of +0.56). Hence, by putting an anti-reflection coating on this facet to reduce its reflectivity to zero the power output can be increased by a factor of about 3.6 without increasing the total electric field at the output facet. In practice a certain minimum reflectivity is necessary for laser action, and so the whole of this factor of improvement is not achievable with a positive electric vector amplitude reflection coefficient. The three layer titania and silica coating of the preferred embodiment however possesses a calculated electric vector amplitude reflection coefficient of −0.64. Therefore with this coating, the power output can be increased by a factor of about 16.5 without increasing the total electric field at the output facet. Adaptation of the formula derived for the three layer structure shows that a five layer titania and silica coating has a calculated electric vector amplitude reflection coefficient of −0.85. Therefore for this five layer coating the power output can be increased by a factor of about 46.3 without increasing the total electric field at the output facet.

It is to be understood that the foregoing description of specific examples of this invention is made by way of example only and is not to be considered as a limitation on its scope.

I claim:
1. A semiconductor injection laser comprising a semiconductor body having an active region and optical reflective facets at opposite ends, one of said ends being a light emitting output end, means applying an energizing voltage to said laser, and an optical interference antireflective dielectric coating on said output end facet having a negative electric vector amplitude reflection coefficient and including an odd number of alternately high and low refractive index quarter-wavelength thickness layers.

2. The injection laser of claim 1 wherein the reflecting facet at the other end includes another optical interference dielectric coating having a negative electric vector amplitude reflection coefficient and an even number of alternately high and low refractive index quarter-wavelength thickness coatings with an outer reflective metallic layer.

3. The injection laser of claim 2 wherein the intensity coefficient of reflectivity of the coated output facet is greater than that of the facet before it was coated and the electric fields of incident and reflected light at said output facet are out of phase.

4. The injection laser of claim 3 wherein the laser is a GaAs laser.

5. The injection laser of claim 4 wherein said antireflection dielectric coating is three layers of titania, silica and titania.

6. The injection laser of claim 5 wherein said another optical interference dielectric coating is quarter-wavelength dielectric layers of titania and silica and said outer reflective metallic layer is aluminum.

7. The injection laser of claim 3 wherein the coatings on each facet are silicon monoxide and silica.